(12) United States Patent
Gong et al.

(10) Patent No.: US 12,027,519 B2
(45) Date of Patent: Jul. 2, 2024

(54) SEMICONDUCTOR SUPER-JUNCTION POWER DEVICE

(71) Applicant: SUZHOU ORIENTAL SEMICONDUCTOR CO., LTD., Jiangsu (CN)

(72) Inventors: Yi Gong, Jiangsu (CN); Wei Liu, Jiangsu (CN); Lei Liu, Jiangsu (CN); Yuanlin Yuan, Jiangsu (CN); Rui Wang, Jiangsu (CN)

(73) Assignee: SUZHOU ORIENTAL SEMICONDUCTOR CO., LTD., Jiangsu (CN)

( * ) Notice: Subject to any disclaimer, the term of this patent is extended or adjusted under 35 U.S.C. 154(b) by 129 days.

(21) Appl. No.: 17/439,689

(22) PCT Filed: Dec. 5, 2019

(86) PCT No.: PCT/CN2019/123424
§ 371 (c)(1),
(2) Date: Sep. 15, 2021

(87) PCT Pub. No.: WO2021/103097
PCT Pub. Date: Jun. 3, 2021

(65) Prior Publication Data
US 2022/0352149 A1   Nov. 3, 2022

(30) Foreign Application Priority Data
Nov. 29, 2019 (CN) .......................... 201911202240.9

(51) Int. Cl.
*H01L 27/088* (2006.01)
(52) U.S. Cl.
CPC ................................. *H01L 27/088* (2013.01)

(58) Field of Classification Search
CPC ............... H01L 27/088; H01L 27/0629; H01L 27/0203; H01L 27/0705; H01L 29/41766;
(Continued)

(56) References Cited

U.S. PATENT DOCUMENTS

| | | | |
|---|---|---|---|
| 2006/0145237 A1* | 7/2006 | Kim | H10B 41/35 257/314 |
| 2013/0334565 A1 | 12/2013 | Hutzler et al. | |
| 2017/0213887 A1 | 7/2017 | Guan et al. | |

FOREIGN PATENT DOCUMENTS

| | | |
|---|---|---|
| CN | 106229343 | 12/2016 |
| CN | 107768371 | 3/2018 |
| JP | 2011142339 | 7/2011 |

OTHER PUBLICATIONS

PCT/CN2019/123424 International Search Report dated Aug. 20, 2020.

* cited by examiner

*Primary Examiner* — Cuong B Nguyen
*Assistant Examiner* — Anthony A Pulatov
(74) *Attorney, Agent, or Firm* — Michael Best & Friedrich LLP

(57) ABSTRACT

Provided is a semiconductor super junction power device which includes a super junction MOSFET cell array composed of multiple super junction MOSFET cells. A gate structure of the super junction MOSFET cell includes a gate dielectric layer, a gate and an n-type floating gate. The gate and the n-type floating gate are located above the gate dielectric layer; the gate is located on a side close to the n-type source region, and the n-type floating gate is located on a side close to the n-type drift region; the gate acts on the n-type floating gate through capacitive coupling. The n-type floating gate of at least one MOSFET cell is isolated from the p-type body region through the gate dielectric layer, and (Continued)

the n-type floating gate of at least one MOSFET cell contacts the p-type body region through an opening in the gate dielectric layer to form a p-n junction diode.

5 Claims, 2 Drawing Sheets

(58) Field of Classification Search
CPC ............ H01L 29/0634; H01L 29/7804; H01L 29/0684; H01L 29/66325–66348; H01L 29/7393–7398; H01L 29/083–0839; H01L 29/0696; H01L 29/1095; H01L 29/7375; H01L 29/66674–66734; H01L 29/7801–7826; H01L 29/04–045; H01L 29/16–1608; H01L 29/18–185; H01L 29/22–2206; H01L 29/36–365; H01L 29/0856–0869; H01L 29/0873–0886; H01L 29/66666; H01L 29/66712–66734; H01L 29/7802–7815; H01L 29/7827–7828; H01L 29/78642; H01L 2924/13055; H01L 21/823487; H01L 51/057

See application file for complete search history.

SEMICONDUCTOR SUPER-JUNCTION POWER DEVICE

CROSS-REFERENCE TO RELATED APPLICATIONS

This is a National Stage Application, filed under 35 U.S.C. 371, of International Patent Application No. PCT/CN2019/123424, filed on Dec. 5, 2019, which claims priority to Chinese Patent Application No. 201911202240.9 filed on Nov. 29, 2019, the disclosures of both of which are incorporated herein by reference in their entireties.

TECHNICAL FIELD

The present application belongs to the technical field of semiconductor super junction power devices, for example, relates to a semiconductor super junction power device with an adjustable reverse recovery speed.

BACKGROUND

A sectional structure of a semiconductor super junction power device in the related art is shown in FIG. 1. The device includes the followings: an n-type drain region 50 connected to a drain through a drain contact metal layer 58; an n-type drift region 51 located above the n-type drain region 50; a p-type body region 52 located at a top of the n-type drift region 51; an n-type source region 53 located in the p-type body region 52, where the n-type source region 53 and the p-type body region 52 are connected to a source through a source contact metal layer 57; a p-type columnar doping region 59 located below the p-type body region; a current channel located in the p-type body region 52 and between the n-type source region 53 and the n-type drift region 51; and a gate structure controlling the current channel to be turned on and turned off. The gate structure includes a gate dielectric layer 54 and a gate 55.

In the case where the semiconductor super junction power device in the related art is turned off, a reverse current flows through a parasitic body diode in the semiconductor super junction power device. In this case, the current in the body diode injects minority carriers, and reverse recovery of these minority carriers is carried out when the semiconductor super junction power device is turned on again, causing a relatively large reverse recovery current and long reverse recovery time. In the related art, lifetime control technologies such as electron irradiation and deep level recombination center are usually used for improving the reverse recovery speed of the semiconductor super junction power device. The disadvantages of this method are that the process difficulty is increased, the manufacturing cost is increased, and the reverse recovery speed of the semiconductor super junction power device cannot be accurately controlled.

SUMMARY

The present application provides a semiconductor super junction power device with an adjustable reverse recovery speed to solve the technical problem that the reverse recovery speed of the semiconductor super junction power device cannot be accurately controlled in the related art.

An embodiment of the present disclosure provides a semiconductor super junction power device. The device includes an n-type drain region, an n-type drift region located above the n-type drain region and a super junction metal-oxide-semiconductor field effect transistor (MOSFET) cell array composed of a plurality of super junction MOSFET cells. Each of the plurality of super junction MOSFET cells includes: a p-type body region located at a top of the n-type drift region, a p-type columnar doping region located below the p-type body region, an n-type source region located in the p-type body region, a gate structure located above the p-type body region, where the gate structure includes a gate dielectric layer, a gate and an n-type floating gate; the gate and the n-type floating gate are located above the gate dielectric layer; in a lateral direction, the gate is located on a side close to the n-type source region, the n-type floating gate is located on a side close to the n-type drift region; and the gate acts on the n-type floating gate through capacitive coupling. In the super junction MOSFET cell array, the n-type floating gate of at least one MOSFET cell of the plurality of MOSFET cells is isolated from the p-type body region through the gate dielectric layer, and the n-type floating gate of at least one MOSFET cell of the plurality of MOSFET cells contacts the p-type body region through an opening to form a p-n junction diode, where the opening is located in the gate dielectric layer located below the n-type floating gate.

In an embodiment, in the semiconductor super junction power device of the present application, the gate extends above the n-type floating gate.

In an embodiment, in the semiconductor super junction power device of the present application, the gate extends above the n-type floating gate and covers a sidewall of the n-type floating gate close to the n-type drift region.

In an embodiment, in the semiconductor super junction power device of the present application, the opening is located below the n-type floating gate and on a side close to the n-type drift region.

In an embodiment, in the semiconductor super junction power device of the present application, a gate of at least one super junction MOSFET cell of the plurality of MOSFET cells is electrically connected to the n-type source region.

According to the semiconductor super junction power device provided by the embodiment of the present disclosure, the reverse recovery speed of the semiconductor super junction power device can be conveniently and accurately controlled by controlling the number of super junction MOSFET cells in which the p-n junction diode is formed, so that the semiconductor super junction power device has a wider application. Meanwhile, when the number of MOSFET cells in which the p-n junction diode is formed is adjusted, only one mask used for forming the opening in the gate dielectric layer needs to be modified, which can effectively control the manufacturing cost of the semiconductor super junction power device.

BRIEF DESCRIPTION OF DRAWINGS

Drawings used in the embodiments are briefly described below.

DETAILED DESCRIPTION

Figure 1:
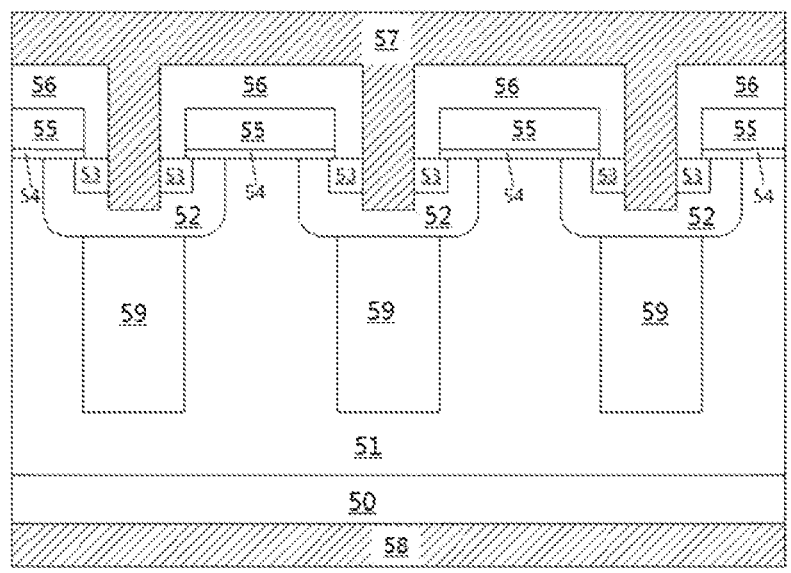
FIG. 1 is a sectional view of a semiconductor super junction power device in the related art.

The scheme of the present application is completely described hereinafter through specific implementations in conjunction with the drawings in the embodiments of the present application. Meanwhile, in the schematic diagrams illustrated in the drawings of the specification, the sizes of layers and regions described in the present application are enlarged, and the sizes illustrated in the drawings do not represent the actual sizes. The embodiments described in the specification are not intended to limit the regions shown in the drawings to specific shapes, but include obtained shapes, for example, deviations due to manufacturing.

Figure 2:
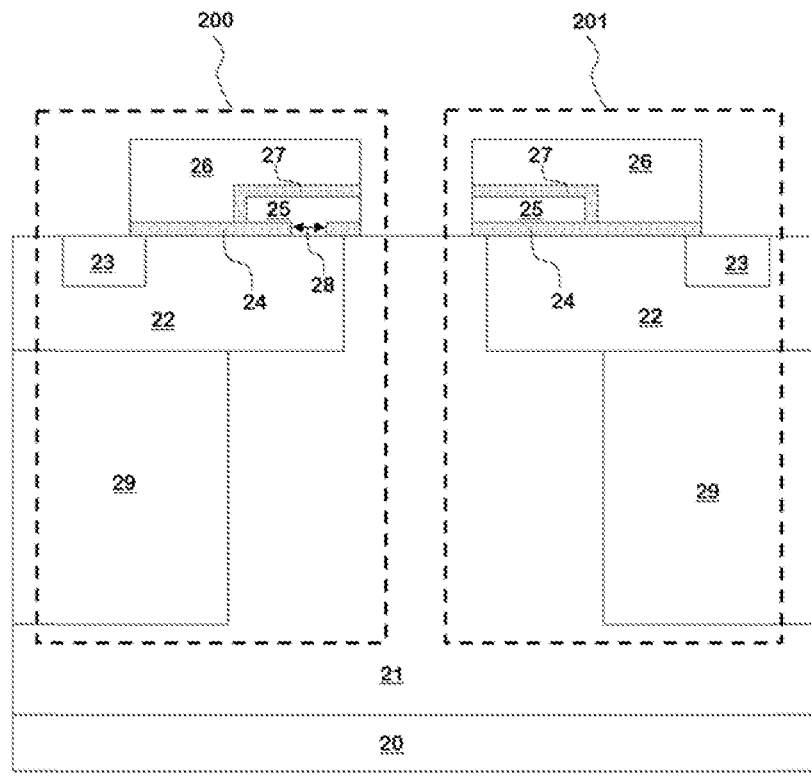
FIG. 2 is a sectional view of a semiconductor super junction power device according to a first embodiment of the present application.

FIG. 2 is a sectional view of a semiconductor super junction power device according to a first embodiment of the present application. As shown in FIG. 2, a semiconductor super junction power device provided by the embodiment of the present application includes an n-type drain region 20, an n-type drift region 21 located above the n-type drain region 20 and a super junction MOSFET cell array composed of multiple super junction MOSFET cells. FIG. 2 exemplarily shows two super junction MOSFET cells (a super junction MOSFET cell 200 and a super junction MOSFET cell 201).

The super junction MOSFET cell of the embodiment of the present disclosure includes a p-type body region 22 located at the top of the n-type drift region 21; a p-type columnar doping region 29 located below the p-type body region 22, where a charge balance is formed between the p-type columnar doping region 29 and an adjacent n-type drift region 21 to improve the pressure tolerant of the semiconductor super junction power device; an n-type source region 23 located in the p-type body region 22; and a gate structure located above the p-type body region 22. The gate structure includes a gate dielectric layer 24, an n-type floating gate 25 and a gate 26. The gate 26 and the n-type floating gate 25 are located above the gate dielectric layer 24; and in a lateral direction, the n-type floating gate 25 is located on a side close to the n-type drift region 21, and the gate 26 is located on a side close to the n-type source region 23 and extends above the n-type floating gate 25. The gate 26 is isolated from the n-type floating gate 25 through an insulating dielectric layer 27, and the gate 26 acts on the n-type floating gate 25 through capacitive coupling. The insulating dielectric layer 27 is generally silicon dioxide.

In the super junction MOSFET cell array of the embodiment of the present disclosure, the n-type floating gate 25 of at least one super junction MOSFET cell (such as the super junction MOSFET cell 201 shown in FIG. 2) is isolated from the p-type body region 22 through the gate dielectric layer 24, and the n-type floating gate 25 of at least one super junction MOSFET cell (such as the super junction MOSFET cell 200 shown in FIG. 2) contacts the p-type body region 22 through an opening 28 to form a p-n junction diode, where the opening is located in the gate dielectric layer 24 located below the n-type floating gate 25.

Figure 3:
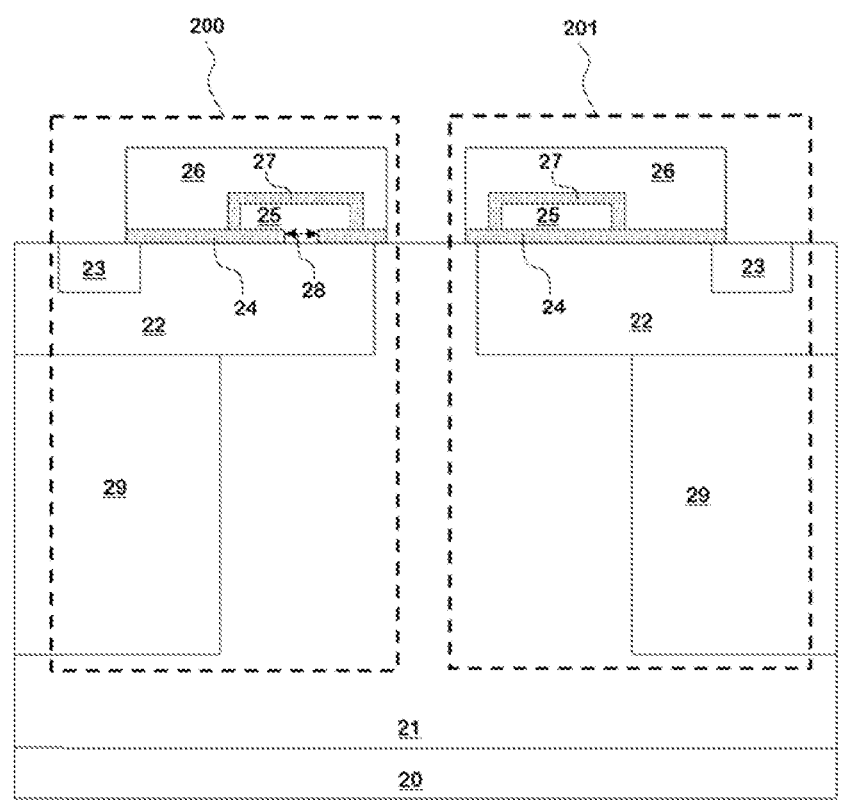
FIG. 3 is a sectional view of a semiconductor super junction power device according to a second embodiment of the present application.

In the embodiment of the present disclosure, in the lateral direction, the gate 26 is located on a side close to the n-type source region 23, and the n-type floating gate 25 is located on a side close to the n-type drift region 21, that is, in the lateral direction, the n-type floating gate 25 is disposed close to the n-type drift region, and the gate 26 is disposed close to the n-type source region 23. In addition, the gate 26 may be entirely located on the side close to the n-type source region 23, that is, the gate 26 may be merely located on the side close to the n-type source region 23. Alternatively, one part of the gate 26 may be located on the side close to the n-type source region 23, and the other part of the gate 26 may extend above the n-type floating gate 25 (as shown in FIG. 2). Alternatively, the gate 26 may extend above the n-type floating gate 25 and cover a sidewall of the n-type floating gate 25 close to the n-type drift region 21 (as shown in FIG. 3). FIG. 3 is a sectional view of a semiconductor super junction power device according to a second embodiment of the present application. FIG. 3 merely exemplarily shows a structure in which the gate 26 of the super junction MOSFET cell 200 in FIG. 2 extends to a side of the n-type drift region 21 and extends above the n-type floating gate 25, and the gate 26 of the super junction MOSFET cell 200 covers a sidewall of the n-type floating gate 25 close to a side of the n-type drift region 21.

The gate 26 extends to a side of the n-type drift region 21, which may increase an area of the n-type floating gate 25 covered by the gate 26, and further increase a capacitive coupling ratio of the gate 26 to the n-type floating gate 25.

In this embodiment of the present disclosure, when the semiconductor super junction power device is in a forward blocking state, the n-type drain region 20 is applied with a high voltage, the p-n junction diode formed by the n-type floating gate 25 and the p-type body region 22 in the super junction MOSFET cell 200 is forward biased, and the n-type floating gate 25 in the super junction MOSFET cell 200 is charged with positive charges. This reduces a threshold voltage Vhtl of a current channel under the n-type floating gate 25 in the super junction MOSFET cell 200. In an embodiment, an opening 28 in the gate dielectric layer 24 is located below the n-type floating gate 25 and on a side close to the n-type drift region 21, that is, in the lateral direction, the opening 28 is located in a region of the gate dielectric layer 24 closer to the n-type drift region 21, which can make the n-type floating gate 25 in the MOSFET cell 200 more easily charged with positive charges.

In this embodiment of the present disclosure, when the semiconductor super junction power device is in the forward blocking state and a forward turn-on state, a drain-source voltage Vds is greater than 0 V, the threshold voltage Vhtl of the current channel under the n-type floating gate 25 in the super junction MOSFET cell 200 has a little influence on a threshold voltage Vth of the entire super junction MOSFET cell 200, and the super junction MOSFET cell 200 still has a high threshold voltage. In this embodiment of the present disclosure, when the semiconductor super junction power device is turned off, and a source-drain voltage Vsd is greater than 0 V, the threshold voltage Vhtl of the current channel under the n-type floating gate 25 in the super junction MOSFET cell 200 has a great influence on the threshold voltage Vth of the entire super junction MOSFET cell 200, so that the super junction MOSFET cell 200 has a low threshold voltage Vth, and thus the current channel of the super junction MOSFET cell 200 is turned on at a low gate voltage (or a voltage of 0 V). This can increase the reverse current flowing through the super junction MOSFET cell 200, reduce the current flowing through a parasitic body diode in the semiconductor super junction power device, and improve the reverse recovery speed of the semiconductor super junction power device.

In the super junction MOSFET cell array of the semiconductor super junction power device in the embodiment of the present disclosure, the number of openings 28 in the gate dielectric layer 24 is controlled, that is, the number of super junction MOSFET cells in which the p-n junction diode is formed is controlled, so that the reverse recovery speed of the semiconductor super junction power device can be conveniently and accurately controlled, and the semiconductor super junction power device has a wider application. Meanwhile, when the number of super junction MOSFET cells in which the p-n junction diode is formed is adjusted, only one mask used for forming the opening 28 in the gate dielectric layer 24 needs to be modified, which can greatly reduce the manufacturing cost of the semiconductor super junction power device.

In the super junction MOSFET cell array of the semiconductor super junction power device in the embodiment of the present disclosure, the gate 26 of at least one super junction MOSFET cell 200 may be electrically connected to the n-type source region 23, that is, this part of the gate 26 is connected to the source voltage, which can reduce gate charges of the semiconductor super junction power device.

What is claimed is:

1. A semiconductor super junction power device, comprising:
   a n-type drain region, a n-type drift region located above the n-type drain region and a super junction metal-oxide-semiconductor field effect transistor (MOSFET) cell array composed of a plurality of super junction MOSFET cells;
   wherein each of the plurality of super junction MOSFET cells comprises: a p-type body region located at a top of the n-type drift region, a p-type columnar doping region located below the p-type body region, a n-type source region located in the p-type body region, and a gate structure located above the p-type body region, wherein the gate structure comprises a gate dielectric layer, a gate and a n-type floating gate, the gate and the n-type floating gate are located above the gate dielectric layer, in a lateral direction, the gate is located on a side close to the n-type source region, and the n-type floating gate is located on a side close to the n-type drift region; and the gate acts on the n-type floating gate through capacitive coupling; and
   wherein in the super junction MOSFET cell array, the n-type floating gate of at least one MOSFET cell of the plurality of super junction MOSFET cells is isolated from the p-type body region through the gate dielectric layer, and the n-type floating gate of at least another one MOSFET cell of the plurality of super junction MOSFET cells contacts the p-type body region through an opening to form a p-n junction diode, wherein the opening is located in the gate dielectric layer located below the n-type floating gate.

2. The semiconductor super junction power device of claim 1, wherein in each of the plurality of super junction MOSFET cells, the gate extends above the n-type floating gate.

3. The semiconductor super junction power device of claim 1, wherein in each of the plurality of super junction MOSFET cells, the gate extends above the n-type floating gate and covers a sidewall of the n-type floating gate close to the n-type drift region.

4. The semiconductor super junction power device of claim 1, wherein in the at least another one MOSFET cell of the plurality of super junction MOSFET cells, the opening is located below the n-type floating gate and on the side close to the n-type drift region.

5. The semiconductor super junction power device of claim 1, wherein the gate of at least another one MOSFET cell of the plurality of super junction MOSFET cells is electrically connected to the n-type source region of the at least another one MOSFET cell of the plurality of super junction MOSFET cells.

* * * * *